United States Patent
Kim et al.

(10) Patent No.: US 6,503,682 B1
(45) Date of Patent: Jan. 7, 2003

(54) PHOTORESIST COMPOSITION, PREPARATION METHOD THEREOF AND METHOD FOR FORMING A PATTERN DURING SEMICONDUCTOR PROCESSING USING THE PHOTORESIST COMPOSITION

(75) Inventors: Young Ho Kim, Suwon (KR); Hoe Sik Chung, Seoul (KR); Sang Mun Chon, Seongnam (KR); Boo Sup Lee, Inchon (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/539,524

(22) Filed: Mar. 30, 2000

(30) Foreign Application Priority Data

Mar. 30, 1999 (KR) .............................. 99-11058
Sep. 30, 1999 (KR) .............................. 99-41936

(51) Int. Cl.$^7$ .............................. G03F 7/023; G03F 7/30
(52) U.S. Cl. ...................... 430/192; 430/165; 430/191; 430/193; 430/326; 534/557
(58) Field of Search ................. 430/192, 326, 430/193; 534/557

(56) References Cited

U.S. PATENT DOCUMENTS 5,178,986 A * 1/1993 Zampini et al. ............ 430/190
5,378,586 A   1/1995 Uetani et al. ............... 430/192
5,529,881 A * 6/1996 Kawabe et al. ............. 430/191
5,629,128 A * 5/1997 Shirakawa et al. ......... 430/192
5,639,587 A * 6/1997 Sato et al. .................. 430/192
5,912,102 A * 6/1999 Kawata et al. .............. 430/191
6,051,358 A * 4/2000 Zampini et al. ............ 430/192

FOREIGN PATENT DOCUMENTS

EP        0579884    11/1993
GB        2212933    8/1989

* cited by examiner

Primary Examiner—John S. Chu
(74) Attorney, Agent, or Firm—Lee & Sterba, P.C.

(57) ABSTRACT

A positive photoresist composition having improved sensitivity and resolution, a method of making the composition, and a method for forming a pattern during semiconductor processing using the composition are disclosed. The photoresist composition includes: (i) a photosensitive material obtained by mixing a first photosensitive compound represented by formula (1) and a second photosensitive compound represented by formulae (2a) or (2b); (ii) a resin; and (iii) a solvent. The invention enables the formation of patterns with an exceptional profile due to a high degree of sensitivity and resolution of the photoresist composition.

20 Claims, 1 Drawing Sheet

PHOTORESIST COMPOSITION, PREPARATION METHOD THEREOF AND METHOD FOR FORMING A PATTERN DURING SEMICONDUCTOR PROCESSING USING THE PHOTORESIST COMPOSITION

BACKGROUND OF THE INVENTION

1. Field of the Invention

The present invention relates to a photoresist composition, a preparation method thereof and a method for forming a pattern during semiconductor processing using the composition. More particularly, the invention relates to a positive photoresist composition which has a high sensitivity and a high resolution for producing patterns having an excellent profile.

2. Description of Related Art

Recently, due to the wide-spread usage of computers in fast developing information media, there is a prevalent need for a semiconductor memory device having a high speed and a large operating storage capacity. Methods for manufacturing semiconductor memory devices currently are being developed to improve the degree of integration, the reliability and the response time. Particularly, the development of photolithography is now important as a critical technique for increasing the degree of integration of the memory devices.

Developments in increasing the degree of integration currently are ongoing. For example, DRAM (dynamic random access memory) devices such as 16 Mbit DRAM and 64 Mbit DRAM, now are mass-produced, and a 256 Mbit DRAM device is under development for mass-production. In addition, mass-producing Giga bit DRAM devices also are currently under development.

As these highly integrated semiconductor devices are being produced, the factors involved in the photolithography process that typically is utilized during manufacture of these devices, are more and more strictly controlled. In particular, the specific photoresist composition that is used for the photoresist process is a basic underlying factor in developing these semiconductor devices. Hence, the requirements for the quality of the photoresist increase every year.

A conventional method for forming a pattern utilizing the photolithography process employing a common photoresist composition can be described as follows. First, a photoresist layer, which usually is an organic layer whose solubility with respect to an alkali-solution changes by exposure to light, such as ultraviolet or X-ray, is coated on a substrate on which a layer to be patterned, such as a dielectric layer or a conductive layer, will be formed. On the photoresist layer, a mask having a predetermined pattern to selectively expose a predetermined portion of the photoresist layer is positioned and the photoresist layer is exposed to light through the mask. Then, the portion having a high solubility (the exposed portion for a positive photoresist) typically is removed by using a developing solution (typically referred to as development) and the portion having a low solubility remains, to thereby produce a photoresist pattern. The portions of the substrate now exposed by the photoresist pattern then can be etched to form a pattern in the substrate, and then the remaining photoresist removed to obtain a desired pattern for wiring and forming an electrode.

As a light source for the exposure, light having a G-line wavelength (436 nm) is widely used as the ultraviolet. However, light having a shorter I-line wavelength (365 nm) is preferred when considering resolution and depth of focus.

As will be appreciated by those skilled in the art, the components of the photoresist composition vary depending on the particular light source.

Typical photosensitive materials employed in a photoresist composition include compounds such as ester compounds of polyhydroxy benzophenone, naphthoquinone diazide-5-sulfonic acid, and the like. Particularly, ester compounds of 2,3,4,4'-tetrahydroxy benzophenone are widely utilized (See Shoji Kawata, Motofumi Kashiwagi, et al., Journal of Polymer Science and Technology, Vol. 4, No. 1 pp. 101–108 (1991)). However, this compound has a lack of transparency for light having an I-line wavelength. As a result, it absorbs light having an I-line wavelength after the exposure, and the profile and resolution of the thus obtained photoresist pattern utilizing an I-line light source is unsatisfactory.

Photoresist compositions including a novolak resin of cresol-formaldehyde, along with a naphthoquinone diazide-substituted photosensitive material, are disclosed in U.S. Pat. Nos. 3,046,118, 3,106,465, 3,148,983, 4,115,128 and 4,173,470, and in Japanese Patent Laid-open Publication No. Sho 62-28457. Typical photoresist compositions including novolak resins and trihydroxy benzophenone-1,2-naphthoquinone diazide sulfonic acid ester are disclosed in L. F. Thompson, "Introduction to Microlithography," ACS Publishing Co. Ltd., No. 219 pp.112–121. In addition, U.S. Pat. No. 5,648,194 discloses photoresist compositions containing alkali-soluble resins, o-naphthoquinone diazide sulfonic acid ester, and vinyl ether, and U.S. Pat. No. 5,468,590 discloses photoresist compositions containing alkali-soluble resins prepared by using quinone diazide compounds and polyphenol. Photoresist compositions having improved physical characteristic which also include novolak resins, quinone diazide compounds and polyphenol are disclosed in U.S. Pat. No. 5,413,895.

As described above, compounds having the naphthoquinone diazide function can be used for the photosensitive material and among them, naphthoquinone diazide-5-sulfonic acid ester, naphthoquinone diazide-4-sulfonic acid ester, and the like are particularly preferred (See J. Kosar, LIGHTSENSITIVE SYSTEMS, John Wiley & Sons Inc. pp.343–361). U.S. Pat. No. 5,714,620 discloses positive photoresist compositions including a quinone diazide sulfonate compound of polyphenol.

To increase the ability of the photosensitive naphthoquinone diazide function to accomplish a high resolution, a method for using a photosensitive material having a large amount of triester groups is disclosed in Japanese Patent Laid-open Publication No. Sho 60-158440. Further, a method for adding an organic solvent having a solubility parameter of 11–12 is disclosed in Japanese Patent Laid-open Publication No. Sho 61-260239. However, since a solvent such as dimethyl sulfoxide is used, the photoresist composition containing the solvent is unstable during storage, and the sensitivity and resolution of the composition is remarkably lowered during extended storage.

Japanese Patent Laid-open Publication No. Hei 1-189644 discloses positive photoresist compositions including a photosensitive group having a specific tris(hydroxyphenyl) methane compound as a base, instead of a naphthoquinone-1,2-diazide sulfonic acid ester of polyhydroxy benzophenone. However, the heat-resistance of this photoresist composition is lower than that of polyhydroxy benzophenone-based composition and the photosensitive group is liable to precipitate, thereby decreasing its storage stability.

Various compounds having phenolic hydroxy groups are known to be useful as photosensitive materials. However, various characteristics such as the sensitivity, resolution, heat-resistance, and the like cannot be satisfied simultaneously. Efforts on improving the physical characteristics by mixing photosensitive compounds having different characteristics have been implemented. For example, U.S. Pat. No. 5,378,586 discloses photoresist compositions having an improved resolution which includes a photosensitive compound that is obtained by mixing diazide-based sulfonic acid esters having different characteristics.

In order to improve the sensitivity, the amount of the photosensitive material in the photoresist should be decreased. This, however, typically will lower the resolution. In order to improve the resolution, the hydrophobicity of the novolak resin should be increased. This, however, typically lowers the sensitivity. As a result, it is difficult to obtain a composition that satisfies both conditions; sensitivity and resolution.

SUMMARY OF THE INVENTION

Hence, there is a need to develop a photoresist composition that can achieve both a high sensitivity and a high resolution simultaneously. In addition, there is a need to develop a single photoresist composition that can be exposed to lights having a G-line wavelength and an I-line wavelength in order to obtain a photoresist pattern having a good profile and resolution during the manufacture of a semiconductor device. Particularly, there is a need to provide a photoresist composition that can be exposed to light having an I-line wavelength to thereby yield a good pattern profile in a more largely integrated device.

It is therefore a feature of the present invention to satisfy these needs by providing a photoresist composition that has improved characteristics, such as improved resolution, heat-resistance, residual ratio, and sensitivity, and that can commonly be applied during the manufacturing process of semiconductor devices. Another feature of the present invention is to provide a suitable method for preparing the positive photoresist composition. A further feature of the present invention is to provide a method for forming patterns having an improved profile by utilizing the above-mentioned photoresist composition.

To accomplish these and other features of the present invention, there is provided a photoresist composition comprising: (i) a photosensitive material obtained by mixing about 30–70% by weight of a first photosensitive compound represented by formula (1) with about 70–30% by weight of a second photosensitive compound represented by formulae (2a) or (2b); (ii) a resin; and (iii) a solvent

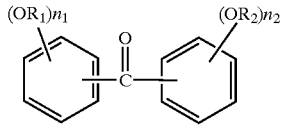

(1)

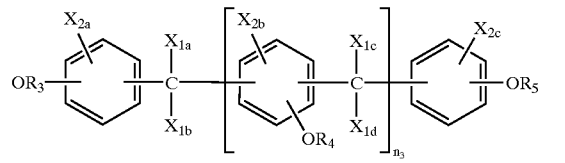

(2a)

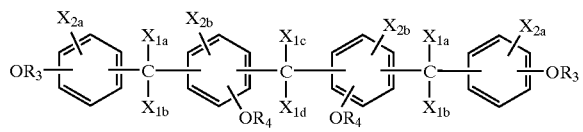

(2b)

wherein in formula (1), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3 and cannot be 0 at the same time, and wherein in formulae (2a) and (2b), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

An additional feature of the present invention can be accomplished by providing a method for making a photoresist composition comprising:

preparing a first photosensitive compound represented by formula (1) by implementing an esterification reaction between a polyol compound represented by formula (1') and at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride;

preparing a second photosensitive compound represented by formulae (2a) or (2b) by implementing an esterification reaction between a polyol compound represented by formulae (2a') or (2b') and at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride;

preparing a photosensitive material by mixing about 30 to about 70% by weight of the first photosensitive compound and about 70 to about 30% by weight of the second photosensitive compound; and dissolving the photosensitive material and a resin in a solvent

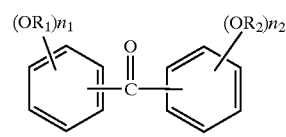

(1)

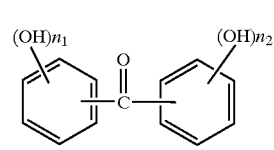

(1')

-continued

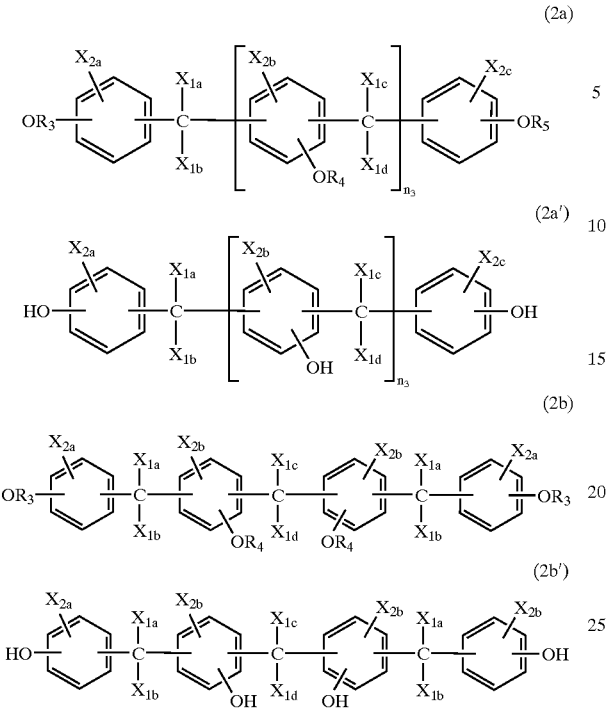

wherein in formulae (1) and (1'), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3, and cannot be 0 at the same time; and wherein in formulae (2a), (2a'), (2b) and (2b'), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

To accomplish an additional feature of the present invention, there is provided a method for forming a pattern comprising:

providing a substrate;

forming a photoresist layer on a substrate by coating a photoresist composition including: (i) a photosensitive material obtained by mixing about 30 to about 70% by weight of a first photosensitive compound represented by formula (1) and about 70 to about 30% by weight of a second photosensitive compound represented by formulae (2a) or (2b); (ii) a resin; and (iii) a solvent;

exposing the photoresist layer utilizing a light source; and forming a photoresist pattern by developing the exposed photoresist layer

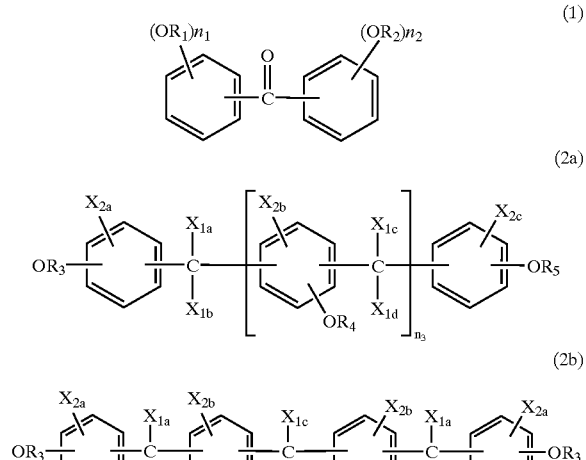

wherein in formula (1), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3 and cannot be 0 at the same time, and wherein in formulae (2a) and (2b), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ is and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF PREFERRED EMBODIMENTS

Figure 1A:
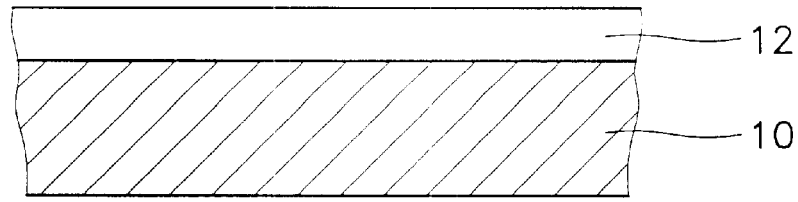
FIGS. 1a to 1c are schematic cross-sectional views illustrating a method for forming a pattern utilizing a photoresist composition according to the present invention.

Korean patent application Nos. 99-11058 and 99-41936, filed respectively on Mar. 30, 1999 and Sep. 30, 1999, each entitled: "Photoresist Composition, Preparation Method Thereof and Method for Forming Pattern in Semiconductor Processing Using the same," are incorporated by reference herein in their entirety. Hereinafter, the present invention will be explained in more detail with reference to the accompanying drawings.

A first photosensitive compound used in the present invention preferably is represented by the following formula (1):

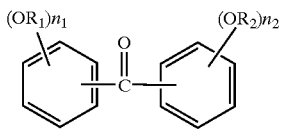

(1)

wherein in formula (1), $R_1$ and $R_2$ (which may be the same or different from each other) independently are selected from a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, where $R_1$ and $R_2$ cannot be a hydrogen atom at the same time, $n_1$ and $n_2$ represent 0, 1, 2 or 3 and cannot be 0 at the same time.

Particularly preferred examples of the first photosensitive compound represented by formula (1) include a 1,2-naphthoquinone diazide-4-sulfonate of 2,3,4,4'-tetrahydroxy benzophenone, a 1,2-naphthoquinone diazide-5-sulfonate of 2,3,4,4'-tetrahydroxy benzophenone, a 1,2-naphthoquinone diazide-6-sulfonate of 2,3,4,4'-tetrahydroxy benzophenone, and the like.

A second photosensitive compound used in the present invention preferably is represented by the following formulae (2a) or (2b):

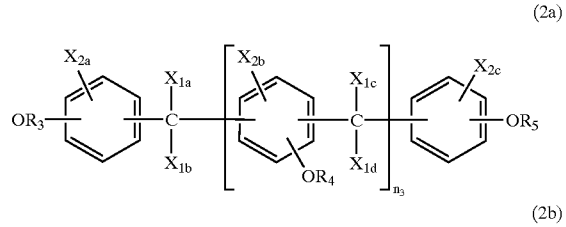

(2a)

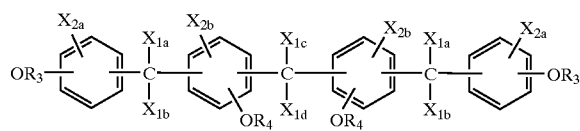

(2b)

wherein in formulae (2a) and (2b), $R_3$, $R_4$ and $R_5$ (which may be the same or different from one another) independently are selected from a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, where $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ (which may be the same or different from one another) are independently a hydrogen atom or an alkyl group, and $n_3$ represents 1 or 2.

Preferred examples of the second photosensitive compound represented by formulae (2a) or (2b) include a 1,2-naphthoquinone diazide-4-sulfonate of non-benzophenone having 3 or 4 monohydroxy alkylbenzene rings, a 1,2-naphthoquinone diazide-5-sulfonate of non-benzophenone having 3 or 4 monohydroxy alkylbenzene rings, a 1,2-naphthoquinone diazide-6-sulfonate of non-benzophenone having 3 or 4 monohydroxy alkylbenzene rings, and the like.

A photosensitive material of the present invention preferably is prepared by mixing together the first and second photosensitive compound. The first photosensitive compound has excellent sensitivity while exhibiting somewhat a lower resolution, and the second photosensitive compound has excellent resolution while undesirably exhibiting too high a sensitivity.

In the present invention, the first photosensitive compound preferably is present in the above-described mixture in an amount of from about 30% to about 70% by weight, based on the weight of the mixture. If the first photosensitive compound is mixed in an amount below 30% by weight, the sensitivity of the composition may become too low, and if over 70% by weight, the heat-resistance may decrease. In the present invention, the second photosensitive compound preferably is present in the above-described mixture in an amount of from about 70% to about 30% by weight, based on the weight of the mixture. If the second photosensitive compound is mixed in an amount of over 70% by weight, the sensitivity of the composition may become too low, and if below 30% by weight, the heat-resistance may decrease. Accordingly, the mixing ratio of the first and second photosensitive compound should be in the range of from about 30:70 to about 70:30% by weight, based on the total weight of the composition.

If the amount of the photosensitive material, which includes the first and second photosensitive compounds, is below 10 parts by weight, based on 100 parts by weight of the resin, the resolution can become low, and if over 100 parts by weight, the sensitivity of the photoresist composition may become low. Therefore, the preferred amount of the photosensitive material is in the range of from about 10 to about 100 parts by weight, based on 100 parts by weight of the resin, and more preferably, in the range of from about 10 to about 50 parts by weight.

If the first photosensitive compound included in the preferred naphthoquinone diazide sulfonate-based photosensitive material has an esterification ratio below about 40%, or if the second photosensitive compound has an esterification ratio below 20%, the thickness of the photoresist layer after the development decreases from a standard thickness, while the sensitivity becomes higher than that of a conventional photosensitive material. Also, if the esterification ratio of the second photosensitive compound is over 90%, the sensitivity becomes too high and the stability of the composition is lowered. Accordingly, the first photosensitive compound preferably has an esterification ratio within the range of from about 40 to about 100%, and the second photosensitive compound preferably has an esterification ratio within the range of from about 20 to about 90%. More preferably, the esterification ratio of the first photosensitive compound is within the range of from about 60 to about 90%, and the esterification ratio of the second photosensitive compound is within the range of from about 50 to about 70%.

It is preferred in the present invention that the resin is a resin applicable to a positive photoresist, and that the resin is a novolak resin. The novolak resin is widely used as a positive and alkali-soluble resin. The novolak resin preferably is prepared by condensing a phenol compound such as m-cresol, p-cresol, and 2,3,5-trimethyl phenol, or mixtures thereof, with formaldehyde.

The novolak resin preferably is prepared by reacting a phenol compound with an aldehyde compound in the presence of an acid catalyst. Particularly preferred phenols include, for example, m-cresol, p-cresol, o-cresol, xylenol compounds such as 2,3-xylenol, 2,5-xylenol, 3,5-xylenol and 3,4-xylenol, alkyl phenols such as 2,3,5-trimethyl phenol, 2,3,5-triethyl phenol, m-ethyl phenol, p-ethyl phenol, o-ethyl phenol, 4-tert-butyl phenol, 3-tert-butyl phenol, 2-tert-butyl phenol, 2-tert-butyl 4-methyl phenol, 2-tert-butyl-5-methyl phenol, alkoxy phenols such as p-methoxy phenol, m-methoxy phenol, p-ethoxy phenol and m-ethoxy phenol, isopropenyl phenols such as o-isopropenyl phenol, p-isopropenyl phenol, 2-methyl 4-isopropenyl phenol and 2-ethyl 4-isopropenyl phenol, polyhydroxy phenols, and the like. The compounds can be used as a single compound or as a mixture of two or more compounds. More preferably, the novolak resin can be prepared by using a 3-compound phenol mixture of m-cresol, p-cresol and 2,3,5-trimethyl phenol.

Particularly preferred aldehyde compounds include formaldehyde (formalin), para-formaldehyde, acetaldehyde, propionaldehyde, butyl aldehyde, trimethyl aldehyde, benzaldehyde, terephthal aldehyde, phenyl acetaldehyde, m-hydroxy benzaldehyde, p-hydroxy benzaldehyde, o-hydroxy benzaldehyde, m-methyl benzaldehyde, p-methyl benzaldehyde, and the like. The aldehyde compound can be employed as a single component, or as a mixture of two or more compounds. More preferably, formaldehyde is used as the aldehyde compound.

In addition, the acid catalyst used in the condensation reaction can be an inorganic acid such as hydrochloric acid, sulfuric acid and phosphoric acid, or an organic acid such as acetic acid, p-toluene sulfonic acid and oxalic acid. Among them, oxalic acid is most preferable. The condensation preferably is implemented at about 60 to about 120° C. for about 2 to about 30 hours.

The thus obtained novolak resin preferably has a polystyrene-converted average molecular weight of from about 1,000 to about 20,000, more preferably from about 2,000 to about 10,000, and most preferably from about 5,000 to about 7,000, calculated by Gel permeation chromatography. A particularly preferred resin is a novolak resin prepared by condensing a phenol compound selected from m-cresol, p-cresol, 2,3,5-trimethyl phenol, and mixtures thereof, with formaldehyde in the presence of an oxalic acid catalyst, and the resin has a polystyrene-converted average molecular weight of about 5,000–7,000 (especially 6,000). The amount of the novolak resin preferably is within the range of from about 10 to about 60% by weight, based on the solid content in the positive photoresist composition.

Any solvent that does not react with the photosensitive material and the novolak resin can be used in the positive photoresist composition according to the present invention. Specifically, the solvent preferably has enough solubility and an appropriate drying speed in order to provide a homogeneous and flat coated layer after the solvent has dried. In the present invention, an alkyl lactate-based solvent that can dissolve the photosensitive material and the novolak resin, and an acetate-based solvent that has a good layer-forming ability, can be preferably used. These solvents can be used as a single-component solvent or as a mixture of the two solvents.

Preferably, a mixture of ethyl lactate and butyl acetate can be used as the solvent. If the amount of ethyl lactate is over 80% by weight, based on the weight of the solvent mixture, the solubility is good, but the viscosity of the composition may be too high and the layer-forming characteristic therefore may become unsatisfactory. If the amount of butyl acetate is over 70% by weight, based on the weight of the solvent mixture, the layer-forming characteristics are sufficient, but the solubility of the photosensitive material and the novolak resin may be lowered and thus the stability of the composition may become unsatisfactory. Accordingly, the preferred mixing ratio of ethyl lactate and butyl acetate is in the range of from about 80:20 to about 30:70 by weight.

If the photoresist composition including the photosensitive material, the resin, and the solvent has a solids content below 20% by weight, based on the total weight of the composition, the viscosity becomes too low. On the other hand, if the solids content in the composition is over 40% by weight, the viscosity becomes too high, and it becomes difficult to control the thickness of the photoresist layer formed therefrom. Therefore, the photoresist composition preferably has a solids content within the range of from about 20 to about 40% by weight, based on the total weight of the composition. Maintaining the solids content within this range preferably controls the viscosity of the photoresist composition within the range of from about 28 to about 32 cP.

The naphthoquinone diazide-based photosensitive material used in the present invention (e.g., combination of first and second photosensitive compounds) can be prepared by an esterification reaction between a polyol and a naphthoquinone diazide sulfonyl chloride. This preferred reaction will be described in detail below.

First, the first photosensitive compound can be prepared by an esterification reaction between a polyol represented by formula (1') with at least one of 1,2-naphthoquinone diazide-4-sulfonyl chloride, 1,2-naphthoquinone diazide-5-sulfonyl chloride, or 1,2-naphthoquinone diazide-6-sulfonyl chloride:

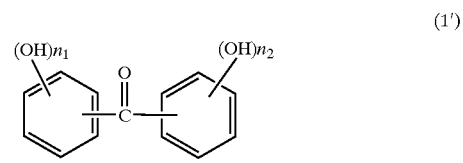

(1')

wherein in formula (1'), $n_1$ and $n_2$ represent 0, 1, 2 or 3, and cannot be 0 at the same time.

Second, the second photosensitive compound preferably can be prepared by an esterification reaction between a polyol represented by formulae (2a') or (2b'), with at least one 1,2-naphthoquinone diazide4-sulfonyl chloride, 1,2-naphthoquinone diazide-5-sulfonyl chloride, or 1,2-naphthoquinone diazide-6-sulfonyl chloride:

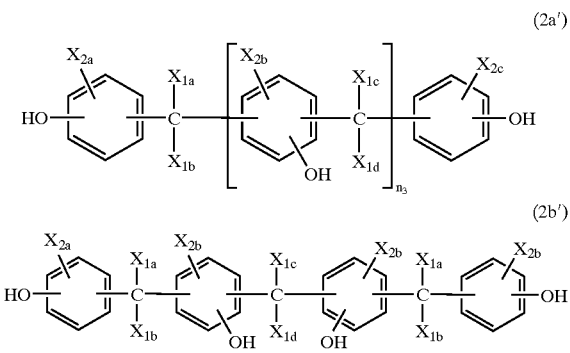

wherein in formulae (2a') and (2b'), $X_{1a}$, $X_{1b}$, $X_{1c}$, $X_{1d}$, $X_{2a}$, $X_{2b}$ and $X_{2c}$ (which may be the same or different from one another), are independently selected from a hydrogen atom or an alkyl group, and $n_3$ represents 1 or 2.

The esterification reactions for preparing the first and second photosensitive compounds are preferably implemented in the presence of bases. Preferred bases can be selected from amine compounds such as trimethyl amine, triethyl amine, triethanol amine, N,N-dimethyl aniline, N,N-diethyl aniline, and pyridine. An inorganic base also can be used to control the sensitivity as occasion needs. Skilled artisans are capable of using an appropriate base, or mixtures thereof, using the guidelines provided herein. The preferred amount of the base is within the range of from 1–5 times by mole of 1,2-naphthoquinone diazide-4, 5 or 6-sulfonyl chloride, and the more preferred amount is within the range of from 1.1–1.2 times by mole.

The esterification reaction generally is implemented in the presence of a component selected from an esterification solvent such as a dioxane compound like 1,4-dioxane, an ether compound like tetrahydrofurane, and a ketone compound like acetone, methyl ethyl ketone, cyclohexanone and 2-heptanone. These components can be used as a single component of as a mixture of two or more compounds.

The amount of the esterification solvent, when used to prepare the first and second photosensitive compounds, preferably is within the range of 2–6 times, and more preferably, within the range of 4–5 times the weight of a polyol compound represented by formula (1'), or the mixing amount of the polyol compound with 1,2-naphthoquinone diazide-4, 5 or 6-sulfonyl chloride represented by formulae (2a') or (2b').

The time used to carry out the esterification reaction preferably is within the range of from about 30 to about 240 minutes. After the reaction is completed, the reactant is filtered to filter off the solid content. Then, from about 1–2% by weight of an aqueous acid such as aqueous acetic acid or aqueous sulfuric acid can be slowly dropped into the remaining filtrate solution to produce a precipitate. This precipitate then can be filtered and washed and then dried to obtain the photosensitive compound of formulae (1), (2a) or (2b).

The novolak resin then can be prepared by condensing a phenol compound such as m-cresol, p-cresol, and 2,3,5-trimethyl phenol, with an aldehyde compound. The thus obtained first and second photosensitive compound and the novolak resin can be dissolved in the solvent in a predetermined mixing ratio. This mixture then preferably is filtered to prepare the photoresist composition according to the present invention.

The first photosensitive compound represented by formula (1) can be exposed to light having a G-line wavelength, while the second photosensitive compound represented by formulae (2a) or (2b) can be exposed to light having an I-line wavelength. After repeated experiments by the present inventors, it was found that a photoresist composition having a photosensitive material that is obtained by mixing the two photosensitive compounds can provide good sensitivity and resolution with respect to both lights having respective G-line and I-line wavelengths. Particularly, a pattern having a good profile can be formed by employing the light having an I-line wavelength (365 nm) and lower short wavelengths which are widely used for obtaining high resolution.

The photoresist composition according to the present invention preferably is coated on a substrate to form a photoresist layer, and then the photoresist layer is selectively exposed by utilizing a mask having a predetermined pattern to selectively expose the photoresist layer. The composition of the present invention can be applied when utilizing lights having respective G-line wavelengths and I-line wavelengths. However, the light having an I-line wavelength is particularly preferred due to its ability to form a finer pattern profile, which typically is required for recent semiconductor devices. The light source can be selected as occasion needs by those skilled in the art, who are capable of selecting a suitable light source using the guidelines provided herein. After completing the exposure, the photoresist pattern preferably is developed to remove the exposed portion, which has a high solubility, while the unexposed portion, which has a lower solubility, remains thereby forming a photoresist pattern. The substrate thus exposed by removal of the respective portions of the photoresist pattern then can be etched, and then the remaining photoresist pattern removed to form a conductive or dielectric pattern for the formation of various wiring, electrodes, and the like.

When forming a pattern according to the present invention, the photoresist composition first is prepared by mixing: (i) a photosensitive material preferably obtained by mixing 30–70% by weight of a first photosensitive compound represented by formula (1) and 70–30% by weight of a second photosensitive compound represented by formulae (2a) or (2b); and (ii) the resin in a suitable solvent. Then, the photoresist composition can be coated on a substrate to form a photoresist layer. The viscosity of the photoresist composition preferably is within the range of from about 28 to about 32 cP, and the substrate or wafer has a rotating velocity within the range of from about 900 to about 4,000 rpm during coating of the photoresist composition. The thickness of thus formed photoresist layer can be varied as occasion needs, and the preferred applicable thickness is within the range of from about 15,000 to about 33,000 Å.

Then, a selected portion of the photoresist layer is exposed by utilizing a mask having a predetermined pattern for selectively exposing the layer. At this time, since the composition of the present invention can react by exposure to any light having a G-line wavelength or an I-line wavelength and below, an appropriate light source can be used. Then, the photoresist layer can be developed by using a suitable developing medium to remove the exposed soluble portion (for a positive photoresist, and the unexposed portion for a negative photoresist) and the remaining unexposed insoluble portion is left for forming a photoresist pattern. The substrate then can be etched and the remaining photoresist removed to form a pattern for various wiring and electrodes.

The preferred examples of the present invention will be described in more detail. However, it should be understood that the present invention is not limited by the following embodiments.

EXAMPLES

Synthesis of Photosensitive Compounds

Synthesis Example 1

A base material (4.0 g) of the photosensitive compound represented by formula (3), 7.0 g of 1,2-naphthoquinone diazide-5-sulfonyl chloride and 300 ml of acetone were added into a three-necked flask and stirred to obtain a solution. Triethyl amine (3.2 g) was slowly added dropwise to the solution and then the thus obtained reactant was stirred for 4 hours at room temperature. After the completion of the reaction, the reactant was filtered. The solid content was filtered off and then a 1% aqueous sulfuric acid was added dropwise to the filtrate solution to produce precipitate. The thus obtained precipitate was filtered and collected and then washed with methanol and dried to produce 3 g of the naphthoquinone diazide sulfonate-based second photosensitive compound designated as compound A-1.

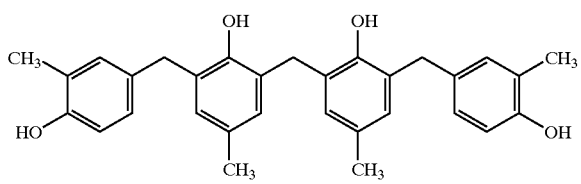

(3)

Synthesis Example 2

A base material (4.0 g) of the photosensitive compound represented by formula (3), 7.0 g of 1,2-naphthoquinone diazide-4-sulfonyl chloride and 300 ml of acetone were added into a three-necked flask and stirred to obtain a solution. Triethyl amine (3.2 g) was slowly added dropwise to the solution and the thus obtained reactant was stirred for 4 hours at room temperature. Hereinafter, the same procedure described in Synthesis Example 1 was implemented to produce 3.1 g of the naphthoquinone diazide sulfonate-based second photosensitive compound designated as compound A-2.

Synthesis Example 3

A base material (4.0 g) of the photosensitive compound represented by formula (4), 6.8 g of 1,2-naphthoquinone diazide-5-sulfonyl chloride and 300 ml of acetone were added into a three-necked flask and stirred to obtain a solution. Triethyl amine (3.0 g) was slowly added dropwise to the solution and the thus obtained reactant was stirred for 4 hours at room temperature. Hereinafter, the same procedure described in Synthesis Example 1 was implemented to produce 5 g of the naphthoquinone diazide sulfonate-based second photosensitive compound designated as compound B-1.

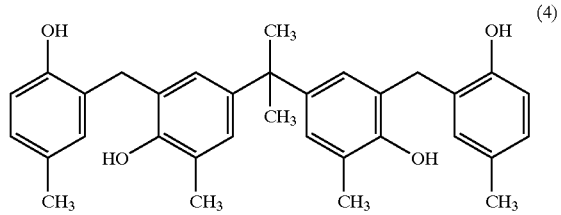

(4)

Synthesis Example 4

A base material (4.0 g) of the photosensitive compound represented by formula (4), 6.8 g of 1,2-naphthoquinone diazide-4-sulfonyl chloride, and 300 ml of acetone were added into a three-necked flask and stirred to obtain a solution. Triethyl amine (3.0 g) was slowly added dropwise to the solution and the thus obtained reactant was stirred for 4 hours at room temperature. Hereinafter, the same procedure described in Synthesis Example 1 was implemented to produce 5.4 g of the naphthoquinone diazide sulfonate-based second photosensitive compound designated as compound B-2.

Synthesis Example 5

A base material (4.2 g) of the photosensitive compound represented by formula (5), 7.4 g of 1,2-naphthoquinone diazide-5-sulfonyl chloride, and 300 ml of acetone were added into a three-necked flask and stirred to obtain a solution. Triethyl amine (3.4 g) was slowly added dropwise to the solution and the thus obtained reactant was stirred for 4 hours at room temperature. Hereinafter, the same procedure described in Synthesis Example 1 was implemented to produce 7.1 g of the naphthoquinone diazide sulfonate-based second photosensitive compound designated as compound C-1.

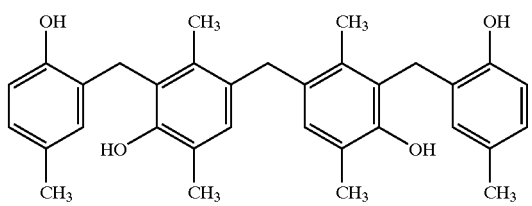

(5)

Synthesis Example 6

A base material (4.0 g) of the photosensitive compound represented by formula (5), 6.8 g of 1,2-naphthoquinone diazide-5-sulfonyl chloride, and 300 ml of acetone were added into a three-necked flask and stirred to obtain a solution. Triethyl amine (3.0 g) was slowly added dropwise to the solution and the thus obtained reactant was stirred for 4 hours at room temperature. Hereinafter, the same procedure described in Synthesis Example 1 was implemented to produce 6 g of the naphthoquinone diazide sulfonate-based second photosensitive compound designated as compound C-2.

Synthesis Example 7

A base material (4.0 g) of the photosensitive compound represented by formula (6), 6.5 g of 1,2-naphthoquinone diazide-5-sulfonyl chloride, and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 6 g of the naphthoquinone diazide sulfonate-based second photosensitive compound designated as compound D-1.

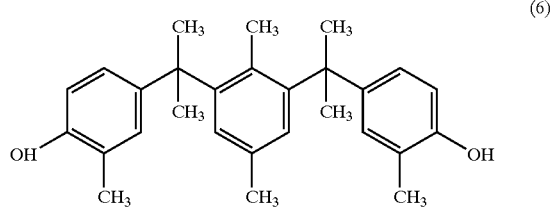

(6)

Synthesis Example 8

A base material (4.0 g) of the photosensitive compound represented by formula (6), 6.5 g of 1,2-naphthoquinone diazide-4-sulfonyl chloride, and 300 ml of acetone were added into a three-necked flask and stirred to obtain a solution. Triethyl amine (2.5 g) was slowly added dropwise to the solution the thus obtained reactant was stirred for 4 hours at room temperature. Hereinafter, the same procedure described in Synthesis Example 1 was implemented to produce 6.3 g of the naphthoquinone diazide sulfonate-based second photosensitive compound designated as compound D-2.

Synthesis Example 9

About 2.5 g of 2,3,4,4'-tetrahydroxy benzophenone, 6.0 g of 1,2-naphthoquinone diazide-5-sulfonyl chloride, and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 5.0 g of an esterification product of 2,3,4,4'-tetrahydroxy benzophenone, a first photosensitive compound E-1.

Synthesis Example 10

About 2.5 g of 2,3,4,4'-tetrahydroxy benzophenone, 6.0 g of 1,2-naphthoquinone diazide-4-sulfonyl chloride, and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 5.3 g of an esterification product of 2,3,4,4'-tetrahydroxy benzophenone, a first photosensitive compound E-2.

Comparative Synthesis Example 1

About 2.3 g of 2,3,4-trihydroxy benzophenone, 6.0 g of 1,2-naphthoquinone diazide-5-sulfonyl chloride, and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 4.8 g of an esterification product of 2,3,4-trihydroxy benzophenone F-1.

Comparative Synthesis Example 2

About 2.3 g of 2,3,4-trihydroxy benzophenone, 6.0 g of 1,2-naphthoquinone diazide-4-sulfonyl chloride, and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 5.0 g of an esterification product of 2,3,4-trihydroxy benzophenone F-2.

Comparative Synthesis Example 3

About 2.3 g of 2,4,4'-trihydroxy benzophenone, 6.0 g of 1,2-naphthoquinone diazide-5-sulfonyl chloride and 300 ml of acetone were added into a three-necked flask and stirred to obtain a solution. Triethyl amine (2.5 g) was slowly added dropwise to the solution and the thus obtained reactant was stirred for 4 hours at room temperature. Hereinafter, the same procedure described in Synthesis Example 1 was implemented to produce 5.98 g of an esterification product of 2,4,4'-trihydroxy benzophenone G-1.

Comparative Synthesis Example 4

About 2.3 g of 2,4,4'-trihydroxy benzophenone, 6.0 g of 1,2-naphthoquinone diazide-4-sulfonyl chloride, and 300 ml of acetone were added into a three-necked flask and stirred to obtain a solution. Triethyl amine (2.5 g) was slowly added to the solution drop by drop and the thus obtained reactant was stirred for 4 hours at room temperature. Hereinafter, the same procedure described in Synthesis Example 1 was implemented to produce 5.0 g of an esterification product of 2,4,4'-trihydroxy benzophenone G-2.

Synthesis of Novolak Resin

Synthesis Example 11

A phenol compound comprised of three components of 50 g of m-cresol, 40 g of p-cresol, and 12 g of 2,3,5-trimethyl phenol, and formaldehyde were condensed in the presence of an oxalic acid catalyst to provide an alkali-soluble novolak resin. The average molecular weight of the novolak resin was 6,000 (as converted to polystyrene).

Synthesis of Photoresist Composition

Example 1

About 1.2 g of the second photosensitive compound A-1 produced by Synthesis Example 1, 0.8 g of the first photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 $\mu$m membrane filter to produce a positive photoresist composition. The solid content of the photoresist composition was 25%, and the viscosity of the composition was from about 28 to about 32 cP.

Example 2

About 1.2 g of the second photosensitive compound B-1 produced by Synthesis Example 3, 0.8 g of the first photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 $\mu$m membrane filter to produce a positive photoresist composition. The solid content of the photoresist composition was 25%, and the viscosity of the composition was from about 28 to about 32 cP.

Example 3

About 1.2 g of the second photosensitive compound C-1 produced by Synthesis Example 5, 0.8 g of the first photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 $\mu$m membrane filter to produce a positive photoresist composition. The solid content of the photoresist composition was 25%, and the viscosity of the composition was from about 28 to about 32 cP.

Example 4

About 1.2 g of the second photosensitive compound D-1 produced by Synthesis Example 7, 0.8 g of the first photosensitive compound E-1 produced by Synthesis Example 9 and 8 g of the alkali-soluble novolak resin produced by Synthesis Example 11 were dissolved in 30 g of a solvent

Example 5

About 1.2 g of the second photosensitive compound A-2 produced by Synthesis Example 2, 0.8 g of the first photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 μm membrane filter to produce a positive photoresist composition. The solid content of the photoresist composition was 25%, and the viscosity of the composition was from about 28 to about 32 cP.

Example 6

About 1.2 g of the second photosensitive compound A-2 produced by Synthesis Example 2, 0.8 g of the first photosensitive compound E-2 produced by Synthesis Example 10 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 μm membrane filter to produce a positive photoresist composition. The solid content of the photoresist composition was 25% and the viscosity of the composition was 28–32 cP.

Example 7

About 1.2 g of the second photosensitive compound C-1 produced by Synthesis Example 5, 0.8 g of the first photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 μm membrane filter to provide a positive photoresist composition. The solid content of the photoresist composition was 25%, and the viscosity of the composition was from about 28 to about 32 cP.

Example 8

About 1.2 g of the second photosensitive compound C-1 produced by Synthesis Example 5, 0.8 g of the first photosensitive compound E-2 produced by Synthesis Example 10 and 8 g of the alkali-soluble novolak resin produced by Synthesis Example 11 were dissolved in 30 g of a solvent mixture obtained by mixing ethyl lactate and butyl acetate in a ratio of 8:2 by weight. The product obtained was filtered by using a 0.2 μm membrane filter to produce a positive photoresist composition. The solid content of the photoresist composition was 25%, and the viscosity of the composition was from about 28 to about 32 cP.

Comparative Example 1

About 2.0 g of the second photosensitive compound A-1 produced by Synthesis Example 1 and 8 g of the alkali-soluble novolak resin produced by Synthesis Example 11 were dissolved in 30 g of a solvent mixture obtained by mixing ethyl lactate and butyl acetate in a ratio of 95:5 by weight. The product obtained was filtered by using a 0.2 μm membrane filter to produce a positive photoresist composition. The solid content of the photoresist composition was 25%, and the viscosity of the composition was from about 28 to about 32 cP.

Comparative Example 2

About 2.0 g of the second photosensitive compound A-2 produced by Synthesis Example 2 and 8 g of the alkali-soluble novolak resin produced by Synthesis Example 11 were dissolved in 30 g of a solvent mixture obtained by mixing ethyl lactate and butyl acetate in a ratio of 30:70 by weight. The product obtained was filtered by using a 0.2 μm membrane filter to provide a positive photoresist composition. The solid content of the photoresist composition was 25%, and the viscosity of the composition was from about 28 to about 32 cP.

Comparative Example 3

About 2.0 g of the second photosensitive compound E-1 produced by Synthesis Example 9 and 8 g of the alkali-soluble novolak resin produced by Synthesis Example 11 were dissolved in 30 g of a solvent mixture obtained by mixing ethyl lactate and butyl acetate in a ratio of 30:70 by weight. The product obtained was filtered by using a 0.2 μm membrane filter to produce a positive photoresist composition. The solid content of the photoresist composition was 25%, and the viscosity of the composition was from about 28 to about 32 cP.

Comparative Example 4

About 1.2 g of the second photosensitive compound E-1 produced by Synthesis Example 9, 0.6 g of the first photosensitive compound F-1 produced by comparative Synthesis Example 1 and 8 g of the alkali-soluble novolak resin produced by Synthesis Example 11 were dissolved in 30 g of a solvent mixture obtained by mixing ethyl lactate and butyl acetate in a ratio of 30:70 by weight. The product obtained was filtered by using a 0.2 μm membrane filter to produce a positive photoresist composition. The solid content of the photoresist composition was 25%, and the viscosity of the composition was from about 28 to about 32 cP.

Comparative Example 5

About 1.2 g of the second photosensitive compound E-1 produced by Synthesis Example 9, 0.6 g of the first photosensitive compound G-1 produced by comparative Synthesis Example 3 and 8 g of the alkali-soluble novolak resin is produced by Synthesis Example 11 were dissolved in 30 g of a solvent mixture obtained by mixing ethyl lactate and butyl acetate in a ratio of 20:80 by weight. The product obtained was filtered by using a 0.2 μm membrane filter to produce a positive photoresist composition. The solid content of the photoresist composition was 25%, and the viscosity of the composition was from about 28 to about 32 cP.

Comparative Example 6

About 0.2 g of the second photosensitive compound A-1 produced by Synthesis Example 1, 1.8 g of the first photosensitive compound E-1 produced by Synthesis Example 9, and 8 g of the alkali-soluble novolak resin produced by Synthesis Example 11 were dissolved in 30 g of a solvent mixture obtained by mixing ethyl lactate and butyl acetate in a ratio of 20:80 by weight. The product obtained was filtered by using a 0.2 μm membrane filter to provide a positive photoresist composition. The solid content of the photoresist composition was 25%, and the viscosity of the composition was from about 28 to about 32 cP.

Comparative Example 7

About 1.8 g of the second photosensitive compound A-1 produced by Synthesis Example 1, 0.2 g of the first photosensitive compound E-1 produced by Synthesis Example 9, and 8 g of the alkali-soluble novolak resin produced by Synthesis Example 11 were dissolved in 30 g of a solvent mixture obtained by mixing ethyl lactate and butyl acetate in a ratio of 20:80 by weight. The product obtained was filtered by using a 0.2 μm membrane filter to produce a positive photoresist composition. The solid content of the photoresist composition was 25%, and the viscosity of the composition was from about 28 to about 32 cP.

Evaluation on the Positive Photoresist Compositions

Photoresist patterns of the photoresist compositions were formed on a wafer to evaluate the photoresist compositions produced by Examples 1–8 and Comparative Examples 1–7.

Figure 1B:
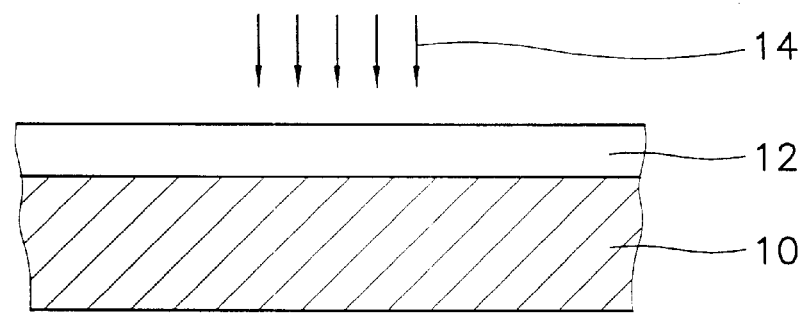
Figure 1C:
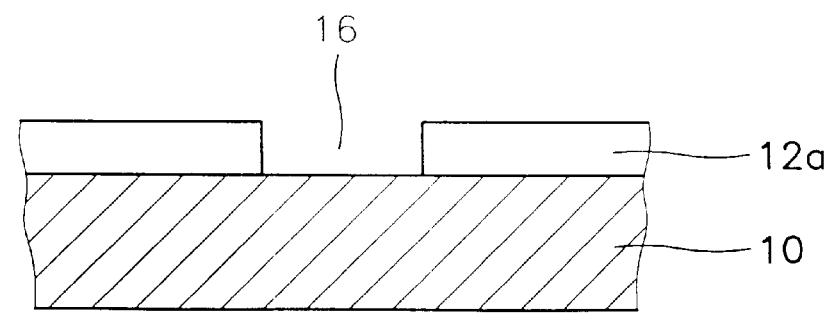

FIGS. 1a to 1c are schematic cross-sectional views illustrating the method used for forming the pattern utilizing the above-described photoresist compositions. Referring now to FIG. 1a, the photoresist compositions of Examples 1–8 and Comparative Examples 1–7 were coated on a silicon wafer 10 with a rotational velocity of from 900 to 4,000 rpm utilizing a spin coater, to form a photoresist layer 12. Then, photoresist layer 12 was baked on a hot plate having a temperature of 90° C. for about 60 seconds. The thickness of photoresist layer 12 was 1.3 μm.

Referring now to FIG. 1b, photoresist layer 12 was selectively exposed to light having an I-line wavelength (365 nm) utilizing a stepper for I-line wavelength 14 and a photo mask (not shown). The photoresist layer then was baked on a hot plate having a temperature of 110° C. for about 60 seconds.

Referring to FIG. 1c, the photoresist layer was developed using a 2.38 wt.% aqueous tetramethyl ammonium hydroxide solution for 1 minute, then washed using water for 30 seconds, and subsequently dried to remove the exposed portion of the photoresist layer. A photoresist pattern 12a which had opened portion 16 to expose a portion of silicon wafer 10, was formed.

The formed photoresist patterns for Examples 1–8 and Comparative Examples 1–7 were examined by using a scanning electron microscope to evaluate the photoresist patterns 12a. The results are shown in Table 1, along with the characteristics of the photoresist compositions.

TABLE 1

|  | photosensitive compound | relative sensitivity | residual ratio (%) | pattern profile (θ) | heat-resistance (° C.) | solution stability |
|---|---|---|---|---|---|---|
| Example No. | | | | | | |
| 1 | (A-1) + (E-1) | 1.7 | 100 | 89 | 135 | ○ |
| 2 | (B-1) + (E-1) | 1.6 | 100 | 88 | 135 | ○ |
| 3 | (C-1) + (E-1) | 1.8 | 100 | 89 | 135 | ○ |
| 4 | (D-1) + (E-1) | 1.5 | 99.5 | 87 | 130 | ○ |
| 5 | (A-2) + (E-1) | 1.7 | 100 | 89 | 135 | ○ |
| 6 | (A-1) + (E-2) | 1.7 | 100 | 89 | 135 | ○ |
| 7 | (C-1) + (E-1) | 1.8 | 100 | 89 | 135 | ○ |
| 8 | (C-1) + (E-2) | 1.8 | 100 | 89 | 135 | ○ |
| Comparative example | | | | | | |
| 1 | (A-1) | 2.4 | 99 | 86 | 115 | X |
| 2 | (A-2) | 2.4 | 98 | 86 | 115 | X |
| 3 | (E-1) | 1.0 | 93 | 82 | 120 | X |
| 4 | (E-1) + (F-1) | 0.8 | 92 | 80 | 125 | Δ |
| 5 | (E-1) + (G-1) | 1.4 | 95 | 83 | 125 | Δ |
| 6 | (A-1) + (E-1) | 1.2 | 94 | 82 | 125 | Δ |
| 7 | (A-1) + (E-1) | 2.2 | 98 | 85 | 115 | Δ |

In Table 1, the relative sensitivity value is represented as a relative value when the threshold energy (Eth) of the photoresist composition produced by Comparative Example 3 was set as 1.0.

The residual ratio (%) indicates the ratio of the photoresist layer remaining at the unexposed portion after developing the unexposed portion of the layer.

The shape of an etching-resistant layer (pattern profile) is represented by the angle of the etching-resistant layer with respect to the plane of the wafer in a cross-section of a 0.6 μm pattern.

The heat-resistance is represented by the temperature of a hot plate when the etching-resistant layer of 100 μm thickness formed on the silicon wafer was baked on the hot plate for 5 minutes.

The solution stability was tested by the degree of change (sensitivity, the amount of precipitate) of the positive photoresist composition after storing the composition at 30° C. for 120 days. In Table 1, ○ represents good, Δ represents common, and × represents bad.

From Table 1, it can be seen that the shapes of the etching-resistant layers of the patterns formed by using the photoresist compositions according to Examples 1–8 are 85 degrees or more, and they have good profiles. On the other hand, the shapes of the etching-resistant layers and the heat-resistances of the photoresist composition according to Comparative Example 3, which includes only the first photosensitive compound, and those of the compositions of Comparative Examples 1 and 2, which include only the second photosensitive compounds, were worse than those of the compositions according to Examples 1–8. Furthermore, the solution stability of the compositions of Comparative Examples 1–3 were unsatisfactory.

For the photoresist compositions including the first photosensitive compound with the conventional photosensitive compound, as in Comparative Examples 4 and 5, the profiles of the etching-resistant layers were poor and exhibited unsatisfactory levels of heat-resistance and solution stability. In addition, for the composition having an excess amount of the first photosensitive compound according to Comparative Example 6, the relative sensitivity, the residual ratio, the pattern profile, the heat-resistance and the solution stability were not satisfactory. For the composition having an excess amount of the second photosensitive compound according to Comparative Example 7, the relative sensitivity was acceptable, but the heat-resistance was unsatisfactory, and the solution stability was average.

Accordingly, the residual ratio, the heat-resistance and the solution stability of the patterns formed by using the photoresist compositions according to Examples 1–8 were better than those of the compositions according to Comparative Examples 1–7.

The thickness of the photoresist layer was 1.3 μm. However, the present inventors have obtained photoresist patterns having the same degree of high quality profile through the formation of photoresist layers having the practically applicable thickness of from about 15,000 to about 33,000 Å.

As described above, the photoresist composition according to the present invention has good resolution, heat-resistance and solution stability. Accordingly, the composition can be stored for an extended period of time, when compared to the conventional compositions, and the patterns obtained by the compositions of the invention exhibit an excellent profile. In addition, the composition can be exposed to both lights having respective G-line wavelengths and I-line wavelengths. Therefore, the light source can be optionally selected as occasion needs. When forming a pattern utilizing the composition of the present invention, the light source can be selected according to the varying manufacturing conditions. Accordingly, the existing conventional equipment can be utilized for obtaining an excellent photoresist pattern in high productivity.

While the present invention has been described in detail referring to the particularly preferred embodiments and drawings, skilled artisans will appreciate that various modifications, alternate constructions and equivalents may be employed without departing from the true spirit and scope thereof.

What is claimed is:

1. A photoresist composition comprising: (i) a photosensitive material obtained by mixing about 30–70% by weight of a first photosensitive compound represented by formula (1) with about 70–30% by weight of a second photosensitive compound represented by formulae (2a) or (2b); (ii) a resin; and (iii) a solvent

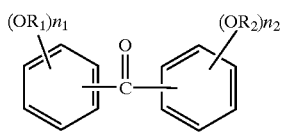

(1)

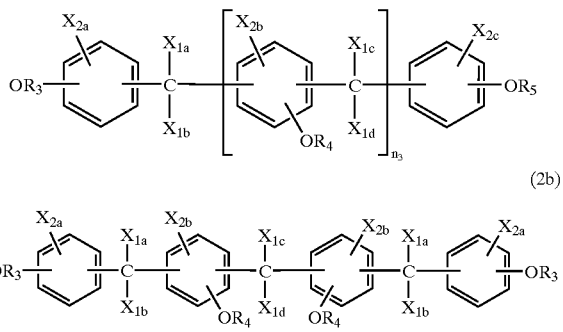

wherein in formula (1), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3 and cannot be 0 at the same time, and wherein in formulae (2a) and (2b), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

2. A photoresist composition as claimed in claim 1, wherein the first photosensitive compound is at least one compound selected from the group consisting of a 1,2-naphthoquinone diazide-4-sulfonate of 2,3,4,4'-tetrahydroxy benzophenone, a 1,2-naphthoquinone diazide-5-sulfonate of 2,3,4,4'-tetrahydroxy benzophenone, a 1,2-naphthoquinone diazide-6-sulfonate of 2,3,4,4'-tetrahydroxy benzophenone, and mixtures thereof.

3. A photoresist composition as claimed in claim 1, wherein the second photosensitive compound is at least one compound selected from the group consisting of a 1,2-naphthoquinone diazide-4-sulfonate of non-benzophenone having 3 or 4 monohydroxy alkylbenzene rings, a 1,2-naphthoquinone diazide-5-sulfonate of non-benzophenone having 3 or 4 monohydroxy alkylbenzene rings, 1,2-naphthoquinone diazide-6-sulfonate of non-benzophenone having 3 or 4 monohydroxy alkylbenzene rings, and mixtures thereof.

4. A photoresist composition as claimed in claim 1, wherein the resin is a novolak resin.

5. A photoresist composition as claimed in claim 4, wherein the novolak resin is prepared by condensing a phenol compound and an aldehyde compound in the presence of an acid catalyst, whereby the novolak resin has a polystyrene-converted average molecular weight within the range of from about 1,000 to about 20,000.

6. A photoresist composition as claimed in claim 5, wherein the novolak resin is prepared by condensing a phenol compound selected from the group consisting of m-cresol, p-cresol, 2,3,5-trimethyl phenol, and mixtures thereof, with formaldehyde in the presence of an oxalic acid catalyst, whereby the novolak resin has a polystyrene-converted average molecular weight within the range of from about 5,000 to about 7,000.

7. A photoresist composition as claimed in claim 1, wherein the solvent is selected from the group consisting of ethyl lactate, butyl acetate, and a mixture of ethyl lactate and butyl acetate in a mixing ratio of from about 80:20 to about 30:70 by weight.

8. A photoresist composition as claimed in claim 1, wherein the photoresist composition has a solids content within the range of from about 20 to about 40% by weight, based on the total amount of the photoresist composition.

9. A photoresist composition as claimed in claim 1, wherein the amount of the first and second photosensitive compound is from about 10 to about 100 parts by weight, based on 100 parts by weight of the resin.

10. A photoresist composition as claimed in claim 1, wherein the first photosensitive compound has an esterification ratio within the range of from about 40 to about 100%, and the second photosensitive compound has an esterification ratio within the range of from about 20 to about 90%.

11. A photoresist composition as claimed in claim 1, wherein the photoresist composition has a viscosity within the range of from about 28 to about 32 cP.

12. A method of making a photoresist composition comprising:

preparing a first photosensitive compound represented by formula (1) by implementing an esterification reaction between a polyol compound represented by formula (1') and at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride;

preparing a second photosensitive compound represented by formulae (2a) or (2b) by implementing an esterification reaction between a polyol compound represented by formulae (2a') or (2b') and at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride;

preparing a photosensitive material by mixing about 30 to about 70% by weight of the first photosensitive compound and about 70 to about 30% by weight of the second photosensitive compound; and dissolving the photosensitive material and a resin in a solvent

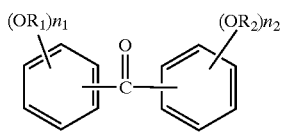

(1)

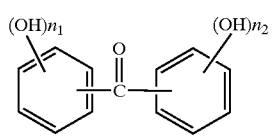

(1')

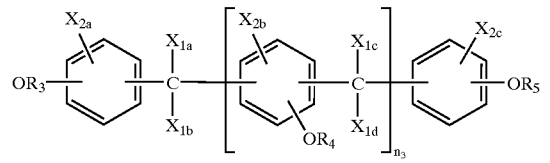

(2a)

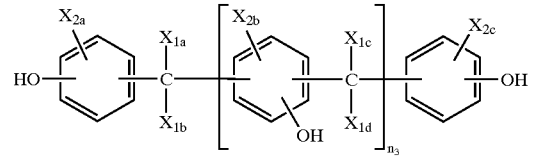

(2a')

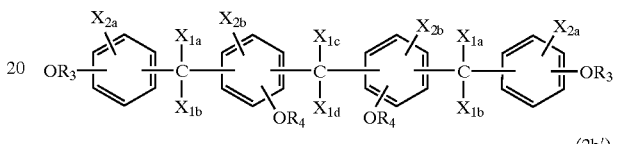

(2b)

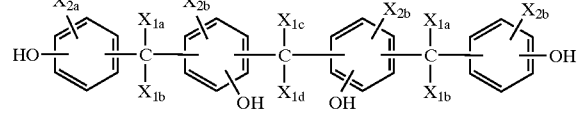

(2b')

wherein in formulae (1) and (1'), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3, and cannot be 0 at the same time; and wherein in formulae (2a), (2a'), (2b) and (2b'), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

13. A method as claimed in claim 12, wherein the esterification reactions used to prepare the first and second photosensitive compounds are respectively implemented in at least one esterification solvent selected from the group consisting of dioxane compounds, ether compounds, ketone compounds, and mixtures thereof.

14. A method as claimed in claim 13, wherein the esterification solvent is present in an amount of from about 2 to about 6 times by weight of the mixing amount of: (i) the respective polyol compound of formulae (1'), (2a') or (2b'); with (ii) at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride.

15. A method as claimed in claim 12, wherein the esterification reactions used to prepare the first and second photosensitive compounds are respectively implemented in the presence of at least one amine selected from the group consisting of trimethyl amine, triethyl amine, triethanol amine, N,N-dimethyl aniline, N,N-diethyl aniline, pyridine, and mixtures thereof.

16. A method as claimed in claim 15, wherein the amine is present in an amount of from about 1 to about 5 times by mole of the at least one compound selected from the group consisting of 1,2-naphthoquinone diazide-4-sulfonyl chloride, 1,2-naphthoquinone diazide-5-sulfonyl chloride, and 1,2-naphthoquinone diazide-6-sulfonyl chloride.

17. A method as claimed in claim 12, wherein the resin is a novolak resin prepared by condensing a phenol compound selected from the group consisting of m-cresol, p-cresol, 2,3,5-trimethyl cresol, and mixtures thereof, with formaldehyde.

18. A method for forming a pattern comprising:

providing a substrate;

forming a photoresist layer on a substrate by coating a photoresist composition including: (i) a photosensitive material obtained by mixing about 30 to about 70% by weight of a first photosensitive compound represented by formula (1) and about 70 to about 30% by weight of a second photosensitive compound represented by formulae (2a) or (2b); (ii) a resin; and (iii) a solvent;

exposing the photoresist layer utilizing a light source; and forming a photoresist pattern by developing the exposed photoresist layer wherein in formula (1), $R_1$ and $R_2$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_1$ and $R_2$ cannot be a hydrogen atom at the same time, $n_1$ and $n_2$ represent 0, 1, 2 or 3 and cannot be 0 at the same time, and wherein in formulae (2a) and (2b), $R_3$, $R_4$ and $R_5$ are independently selected from the group consisting of a hydrogen atom, a 1,2-naphthoquinone diazide-4-sulfonyl group, a 1,2-naphthoquinone diazide-5-sulfonyl group, a 1,2-naphthoquinone diazide-6-sulfonyl group, and mixtures thereof, and $R_3$, $R_4$ and $R_5$ cannot be a hydrogen atom at the same time, $X_{1a}$, $X_{1b}$, $X_{1c}$, $X_{1d}$, $X_{2a}$, $X_{2b}$ and $X_{2c}$ are independently selected from a hydrogen atom or an alkyl group, and $n_3$ represents 1 or 2.

19. A method as claimed in claim 18, wherein the light source generates light having a wavelength of about 365 nm.

20. A method as claimed in claim 18, wherein the photoresist composition has a viscosity within the range of from about 28 to about 32 cP, the photoresist layer is formed on the substrate at a rotational velocity of the substrate within the range of from about 900 to about 4,000 rpm, and the photoresist layer has a thickness within the range of from about 15,000 to about 33,000 Å.

* * * * *